United States Patent [19]

Koubek et al.

[11] Patent Number: 5,179,500
[45] Date of Patent: Jan. 12, 1993

[54] VAPOR CHAMBER COOLED ELECTRONIC CIRCUIT CARD

[75] Inventors: Kevin J. Koubek, South Setauket; Robert L. Kosson, Massapequa; John A. Quadrini, Northport, all of N.Y.

[73] Assignee: Grumman Aerospace Corporation, Bethpage, N.Y.

[21] Appl. No.: 680,618

[22] Filed: Apr. 2, 1991

Related U.S. Application Data

[63] Continuation of Ser. No. 485,523, Feb. 27, 1990, abandoned.

[51] Int. Cl.$^5$ .............................................. H05K 7/20
[52] U.S. Cl. ............................ 361/385; 165/104.14; 165/104.33; 174/15.2; 361/382; 257/714
[58] Field of Search ................ 165/80.4, 80.5, 104.26, 165/104.33, 104.34; 174/15.2; 357/82; 361/381, 382, 385–389

[56] References Cited

U.S. PATENT DOCUMENTS

| | | | |
|---|---|---|---|
| 4,118,756 | 10/1978 | Nelson et al. | 361/385 |
| 4,503,483 | 3/1985 | Basiulis | 361/385 |
| 4,777,561 | 10/1988 | Murphy et al. | 361/385 |

Primary Examiner—Gregory D. Thompson
Attorney, Agent, or Firm—Pollock, VandeSande & Priddy

[57] ABSTRACT

A serpentine continuous vapor passage is formed in a metal card which mounts electronic components. Elongated channels of the passage evaporate the contained liquid in response to conducted heat from mounted electronic components. By mounting the side edges of the card to heat conductive retaining means, the evaporated fluid becomes condensed at end sections of the passage thereby transferring the heat from the card and converting the evaporated liquid in a gaseous state back to a liquid state. The resultant card is gravity-insensitive and a thermal-resistance path is minimized so that the cooling capability of the card becomes maximized.

2 Claims, 3 Drawing Sheets

VAPOR CHAMBER COOLED ELECTRONIC CIRCUIT CARD

This application is a continuation of application Ser. No. 07/485,523, filed Feb. 27, 1990, now abandoned.

FIELD OF THE INVENTION

The present invention relates to electronic circuit cards, and more particularly to such cards in which heat pipe technology is used to dissipate heat therefrom.

BACKGROUND OF THE INVENTION

In many electronic systems, particularly those carried in vehicles such as aircraft where high-density packaging prevails because of space limitations, the efficient cooling of electronic components has become a significant problem. With the advent of large-scale integrated circuit (IC) modules containing many thousands of circuit elements, it has become possible to pack great numbers of electronic components together within a very small volume. As is well known, these integrated circuit modules generate significant amounts of heat during the course of their normal operation. Since most solid state devices are sensitive to excessive temperatures, a solution to the problem of the generation of heat by large scale IC's in close proximity to one another has become of increasing concern to industry.

A typical approach to cooling components in electronic systems in which devices containing integrated circuits are placed on circuit cards is to direct a stream of cooling air across the modules and/or cards. One of the principal disadvantages of this approach is that the air quality (moisture content, contamination, etc.) must be tightly controlled to inhibit corrosion, loss of cooling effectiveness, etc. This feature is necessary in the design of aircraft avionics in particular to assure system reliability. Cooling of components by this means necessitates a number of compromises to the overall system. These compromises include: high pressure drop; uniformity of component form factors; placing the components containing the integrated circuits further apart on the circuit cards; increasing the distance between circuit cards; and increasing the volume and velocity of cooling air directed over the components, which increase requires special considerations in the design of the housings containing the circuit cards and in the mechanical systems for delivering the cooling air.

Increases in the sophistication of electronic systems has brought about denser packaging of electronic components with attendant increases in power density and total card power. This has brought about the evolution of another technique which is a further conventional approach to cooling of card-mounted electronic components. This technique utilizes solid metal thermal mounting cards or plates which conduct the heat dissipated by electronic components to a heat sink disposed at the edge of each card. Such an approach, however, results in a large thermal resistance from the component mounting surface to the heat sink, which causes high component temperatures. In an effort to mitigate this problem with metal cards, the prior art has turned to heat pipe technology.

Heat pipes per se are, of course, well known, as are solid metal circuit cards or boards for mounting electronic components. In the prior art there are also teachings of metal circuit cards incorporating heat pipes for dissipating the heat generated by electronic components mounted on the cards.

BRIEF DESCRIPTION OF THE INVENTION

This invention relates to a circuit card capable of high-density packaging of electronic components and is particularly designed for use in high-power density card racks in computers and other electronic and avionic systems. A solid metal is used for the card upon which the components are mounted and a serpentine vapor chamber is incorporated in the card. The vapor chamber is seen as a continuous series of communicating serpentine sections that are generally oriented horizontally. Each section includes an elongated evaporator region while opposite ends of each section function as condenser regions coinciding with the vertical module edges, the latter being retained in heat-transferring retaining means. A short thermal path results between the coincidence of the retainers and the condenser sections thereby minimizing the thermal path to a heat sink to which the retainers are normally secured. With the serpentine sections oriented horizontally, the module operates in a gravity-assisting mode whereby condensate is gravity-fed back to the horizontally disposed evaporator region for increased cooling efficiency. For operation with the serpentine sections inclined to the horizontal, the lower end of each serpentine will collect liquid, inhibiting its function as a condenser region, and most condensation will occur at the upper end of the serpentine sections. In this orientation, at least half of the serpentine sections will continue to operate, since they will be receiving a gravity-assisted condensate flow. Accordingly, regardless of the orientation of the module, it is gravity-insensitive.

During operation of the invention, the chamber, which has been charged with a vaporizable liquid, converts the liquid between the liquid and gaseous phases due to the two main chamber regions comprising: (1) the evaporator region in which the working liquid is vaporized by input heat; and (2) the condenser regions where the vapor gives up heat and is condensed to liquid. Relatively low flow rates and the serpentine flow pattern make the module gravity-insensitive. By virtue of the present invention, improved thermal conductivity is realizable with the attendant advantage of insensitivity with respect to gravity.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
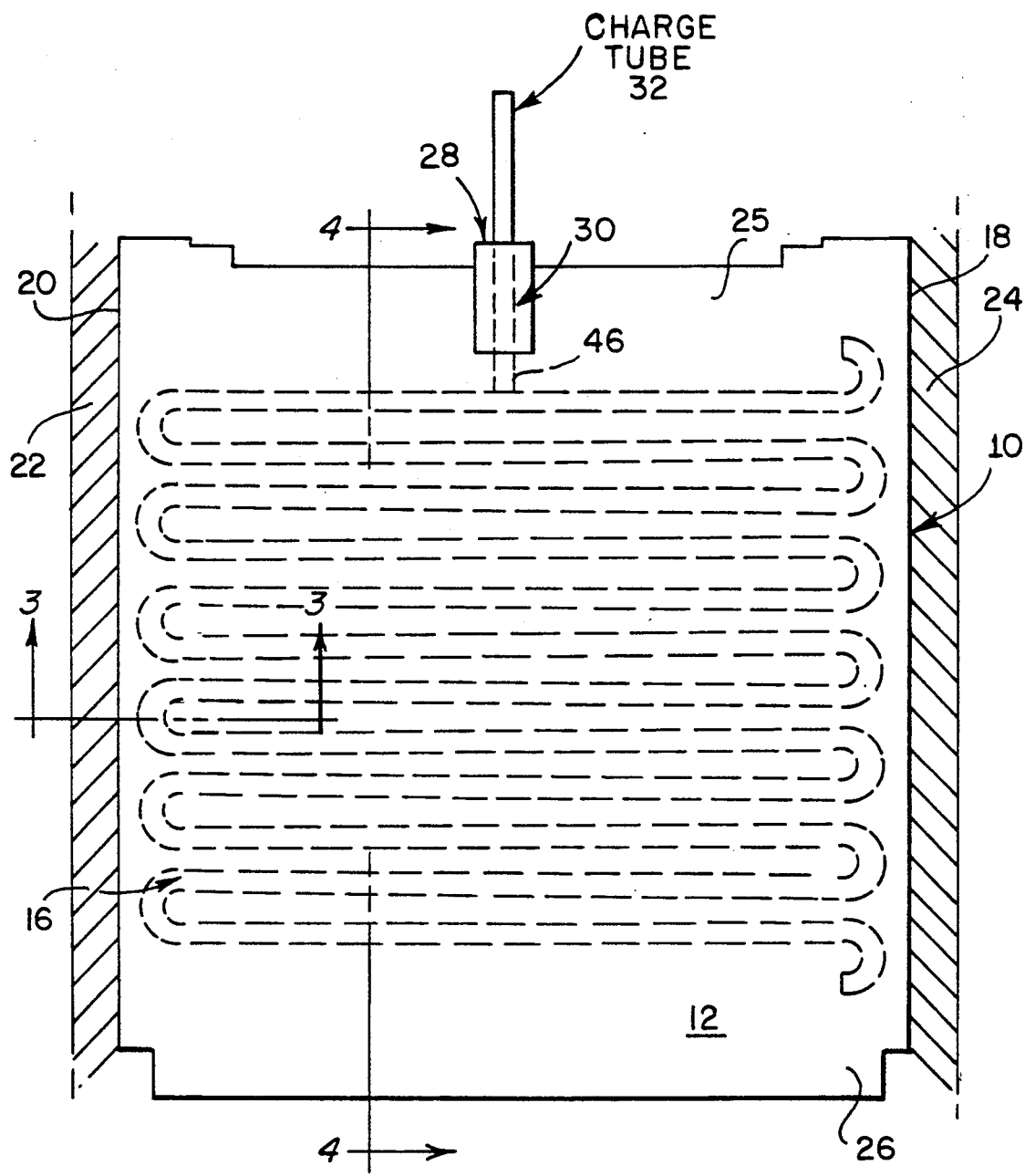
FIG. 1 is an elevational view of the module indicating the internal continuous serpentine vapor chamber.
Figure 2:
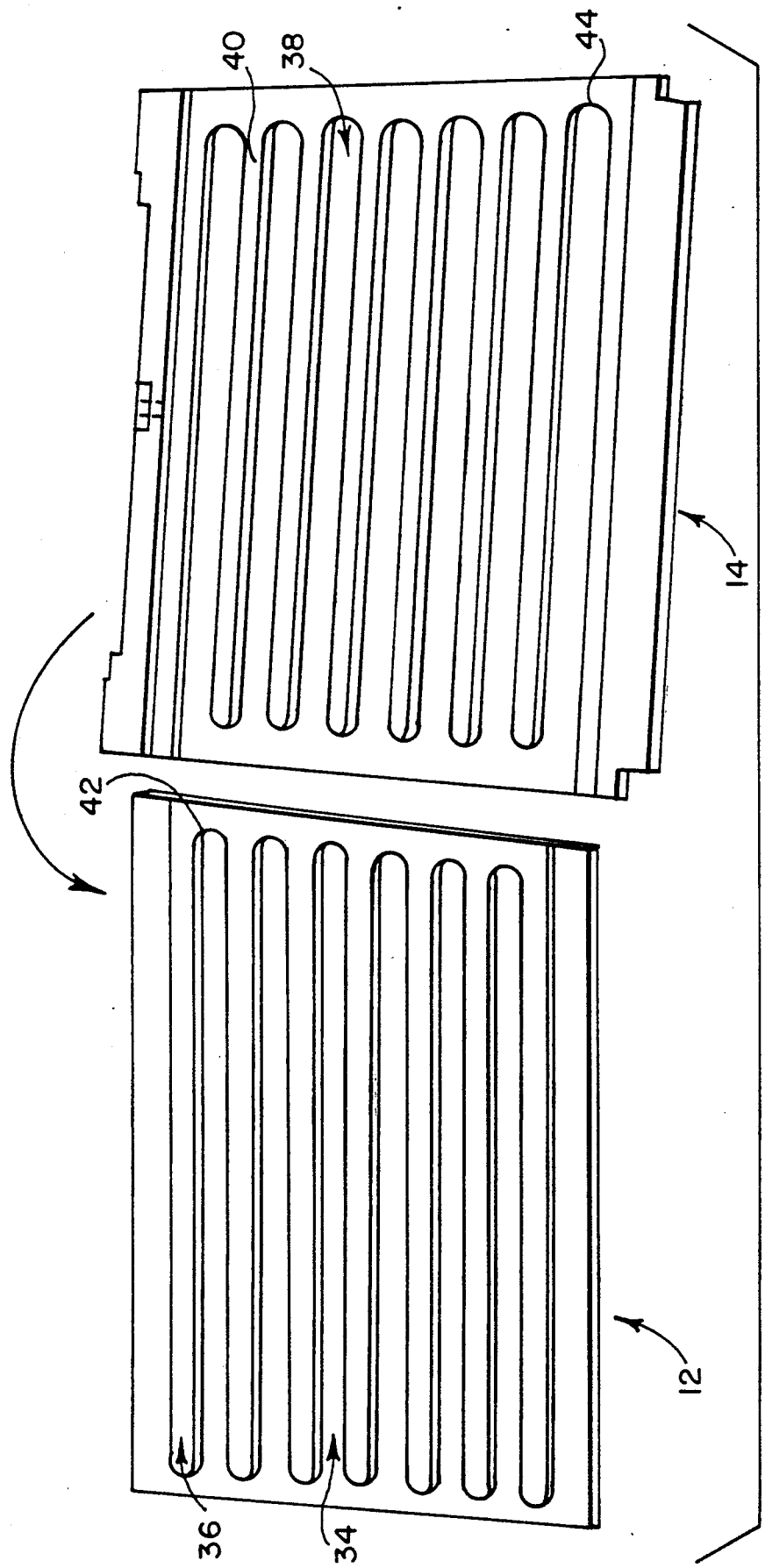
FIG. 2 is a disassembled view showing two mating halves of the module.

FIG. 1 illustrates the completed module 10, which is fabricated from two juxtaposed plates 12 and 14 shown disassembled in FIG. 2. As will be noticed from FIG. 2, grooves are formed in the confronting surfaces of plates 12 and 14 so that when they become assembled, a continuous serpentine passage or chamber 16 is formed. The plates 12 and 14 can be fastened together by use of vacuum braising, fusion bonding, or other suitable conventional technique. The grooves may be formed by die-cast or machine methods of conventional types.

Electronic components have not been illustrated for purposes of clarity but are mounted to the exterior surface of the module 10 and heat conduction away from the components is achieved by evaporating a liquid along heated points of the passage 16. In order to transfer heat away from the module 10, the side edges 18 and 20 of the module 10 are removably mounted to conventional metallic retainers symbolically shown at 22 and 24 which conduct the heat away from the module 10, thereby ensuring that any electronic components may continue operating in a cooled condition. The lower-illustrated side 26 of module 10 is preferably a solid section and presents an additional support surface when mounting the module 10 in a support structure such as a rack.

The upper-illustrated end 28 of module 10 includes a hole 30 into which a charge tube 32 may be inserted and sealed to allow charging of the module 10 with an appropriate two-phase volatile liquid. After the module 10 is filled, the tube 32 is pinched shut or withdrawn and a plug is inserted.

Each section of the continuous vapor passage 16 includes the horizontally extending evaporator portions terminating at opposite ends in condenser portions. Thus, heat from electronic components is transferred along the evaporator sections of the passage to the fluid contained therein, which causes the fluid to evaporate and cool the metal surface of plates 12 and 14. The heat is transferred over the short path to either side where the condenser sections of the passage 16 transfer heat to the retainers 22 and 24. After the heat transfer occurs at the condenser sections, the fluid is changed from the evaporated gaseous state back to the liquid state and flows back toward the horizontally extending evaporator sections to begin a new cycle.

FIG. 2 illustrates the construction of the vapor passage 16 in greater detail. The internal surfaces of each plate 12, 14 is seen to be characterized by a series of respective horizontal grooves 34, 38 separated by respective parallel raised ridges 36, 40. As previously mentioned, the grooves and ridges may be formed by die-casting, machining, or other conventional metal-forming methods.

Each of the right ends of the grooves 34 has a generally U-shaped contour, as indicated by reference numeral 42 for plate 12 and 44 for plate 14.

The previously mentioned hole 30 of FIG. 1 steps down to a coaxially extending bore 46 so that volatile fluid may be introduced into the void of the upper-illustrated groove after the plates 12 have been assembled. Since the passage 16 is continuous, the fluid will fill the entire serpentine continuous chamber 16.

Figure 3:
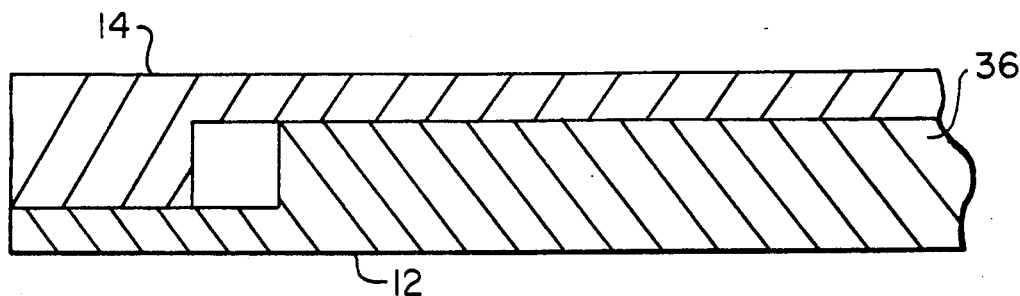
FIG. 3 is a partial sectional view taken along section line 3—3 of FIG. 1.
Figure 4:
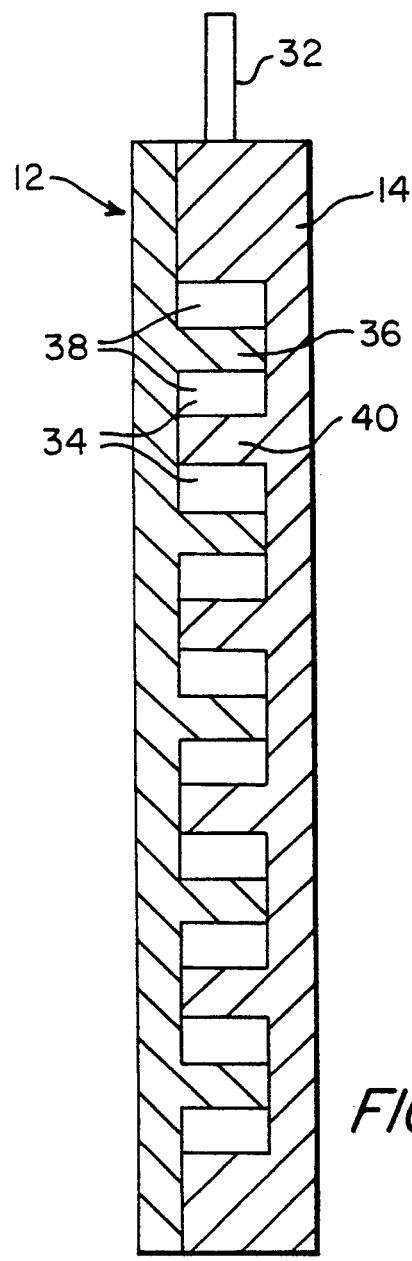
FIG. 4 is a partial sectional view taken along section line 4—4 of FIG. 1.

When the plates 12 and 14 are to be assembled, plate 14 is flipped over plate 12, as indicated by the arrow in FIG. 2. Thus, the U-shaped groove ends 44 will lie on the left vertical edge portion of the assembled device while the U-shaped groove ends 42 lie on the right side. The plates are aligned so that each ridge 36, 40 is positioned medially within a corresponding groove of the confronting plate. Thus, each groove in each of the plates 12 and 14 actually forms two hollowed evaporator channels for the continuous vapor passage 16, as will be appreciated by viewing the completed structure illustrated in FIGS. 1, 3, and 4. Because the grooves of plate 12 partially overlap the grooves of plate 14 (and vice-versa), the number of evaporator channels equals the number of ridges (see FIG. 4).

By employing the serpentine continuous passage 16, a finished device may be manufactured which conducts less heat per evaporator channel than if the individual channels were completely separated.

The shape and dimensions of each channel may be adjusted so that the liquid contained therein develops a meniscus having sufficient curvature to create a capillary pressure differential which will cause liquid flow between the evaporator and condenser sections for a module orientation in which the evaporator sections are nearly horizontal. For more general orientations, in which the evaporator sections are inclined, liquid will tend to collect at the low end of the evaporator sections, inhibiting condensation at that end. At the high end of the evaporator sections, however, the condenser regions will operate at full capability and these condenser regions will feed liquid to at least half the evaporator sections. Because of the close spacing of the evaporator sections, the present device may be considered to be gravity-insensitive. By directly mounting the side edges 18 and 20 (FIG. 1) of the module 10 to appropriate conductive retainers 22 and 24, there is a reduction of the heat flow path between electronic components mounted to the module 10 and the heat-dissipating retaining means; and this approach further minimizes the effect of the thermal resistance of the retainers in the heat conduction process. The retainers 22 and 24 are normally attached to heat sinks which form part of a housing assembly which does not, per se, form part of the present invention.

It should be understood that the invention is not limited to the exact details of construction shown and described herein, for obvious modifications will occur to persons skilled in the art.

We claim:

1. A cooled electronic circuit card comprising:
   a conductive body having a single, branchless, continuous serpentine channel for containing an entire unidirectional series flow of a vaporizable two-phase liquid without branching, the channel having—
   (a) elongated parallel linear sections serving to evaporate the liquid when heat is transferred thereto from a mounted circuit;
   (b) a first set of vertically aligned curved sections, each of which interconnects first ends of immediately adjacent parallel linear sections;
   (c) a second set of vertically aligned curved sections, each of which interconnects second ends of immediately adjacent parallel linear sections, the curved sections of the first set vertically alternating with those of the second set;
   the curved sections serving to condense evaporated liquid for return of the liquid to respective linear sections;
   the curved sections being aligned with mounting edges of the card for minimizing a thermal resistance path between the curved sections and conductive card-retaining means.

2. The circuit card set forth in claim 1 wherein the card comprises two juxtaposed plates having parallel grooves integrally formed in confronting plate surfaces, the grooves being separated by integral parallel spaced ridges, each ridge of one plate being positioned medially extending relationship with the groove in another plate so as to divide each groove into two parallel spaced continuous linear sections.

* * * * *